United States Patent
Jones

(10) Patent No.: US 6,588,919 B1
(45) Date of Patent: Jul. 8, 2003

(54) WAVE SOLDERABLE PEDESTALLED LED

(75) Inventor: Thomas Lee Jones, Ann Arbor, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 244 days.

(21) Appl. No.: 09/680,632

(22) Filed: Oct. 6, 2000

(51) Int. Cl.$^7$ ................................................ H01R 33/00
(52) U.S. Cl. ...................... 362/226; 362/800; 362/368; 439/547; 228/37; 228/260
(58) Field of Search .................... 362/226, 368, 362/396, 800, 249; 228/102, 103, 37, 260; 439/56, 83, 722, 547, 554

(56) References Cited

U.S. PATENT DOCUMENTS

| | | | |
|---|---|---|---|
| 4,195,330 A | * 3/1980 | Savage, Jr. | ................. 362/226 |
| 4,219,172 A | 8/1980 | Murayama | |
| 4,419,722 A | * 12/1983 | Bury | ........................... 362/396 |
| 4,897,769 A | * 1/1990 | Lang | ........................... 362/226 |
| 5,116,229 A | 5/1992 | Savage, Jr. | |
| 5,121,311 A | 6/1992 | Cheselske | |
| 5,426,265 A | 6/1995 | Savage, Jr. | |
| 5,533,663 A | * 7/1996 | Massini et al. | ............. 228/103 |
| 5,754,407 A | 5/1998 | Kohno | |
| 5,807,122 A | * 9/1998 | Heeb et al. | .................... 439/83 |

* cited by examiner

Primary Examiner—Sandra O'Shea
Assistant Examiner—Ali Alavi
(74) Attorney, Agent, or Firm—John E. Kajander, Esq.

(57) ABSTRACT

A pedestalled LED 10 including a light emitting diode element 12 and a tower element 14 for use on the wave soldered side of a circuit board 16. The light emitting diode element 12 and the tower element 14 are capable of withstanding exposure to wave solder 22.

19 Claims, 1 Drawing Sheet

WAVE SOLDERABLE PEDESTALLED LED

TECHNICAL FIELD

The present invention relates generally to a pedestalled LED and more particularly to a pedestalled LED capable of surviving wave soldering.

BACKGROUND OF THE INVENTION

The use of LED's is well-known in the electronics industry. Light emitting diodes are generally disposed on circuitboards so as to permit effective electric connection between the LED and the controlling electronic circuitry. Although LEDs can be positioned directly on the circuitboard, often it is highly desirable to mount the LED some distance above the plane of the circuitboard such that it rises to an established light plane. One known method of positioning the LED above the plane of the circuitboard is through the use of an LED pedestal.

Although pedestalled LEDs have proven to be highly beneficial in establishing desired light planes, the present designs have several undesirable limitations. Current designs of pedestalled LEDs are incapable of withstanding direct contact with wave solder. This characteristic commonly limits the use of present pedestalled LEDs through use on a single side of a circuitboard when wave soldering techniques are employed. Installation of these pedestalled LEDs on the side of the circuitboard directly exposed to wave soldering can result in permanent damage to the pedestalled LEDs. This inability to establish a light plane on the wave soldered side of the circuitboard is highly undesirable. It would, therefore, be highly desirable to have a pedestalled LED capable of withstanding wave soldering such that a light plane could be provided on either side of the circuitboard.

SUMMARY OF THE INVENTION

It is, therefore, an object of the present invention to provide a pedestalled LED capable of withstanding exposure to wave solder.

In accordance with the object of this invention, a pedestalled LED is provided. A pedestalled LED includes a light emitting diode element. The light emitting diode element is supported off the surface of the circuitboard utilizing a tower element. Both the light emitting diode element and the tower element are capable of withstanding direct exposure to wave solder.

Other objects and features of the present invention will become apparent when viewed in light of the detailed description of the preferred embodiment when taken in conjunction with the attached drawings and appended claims.

DESCRIPTION OF THE PREFERRED EMBODIMENT(S)

Figure 1:
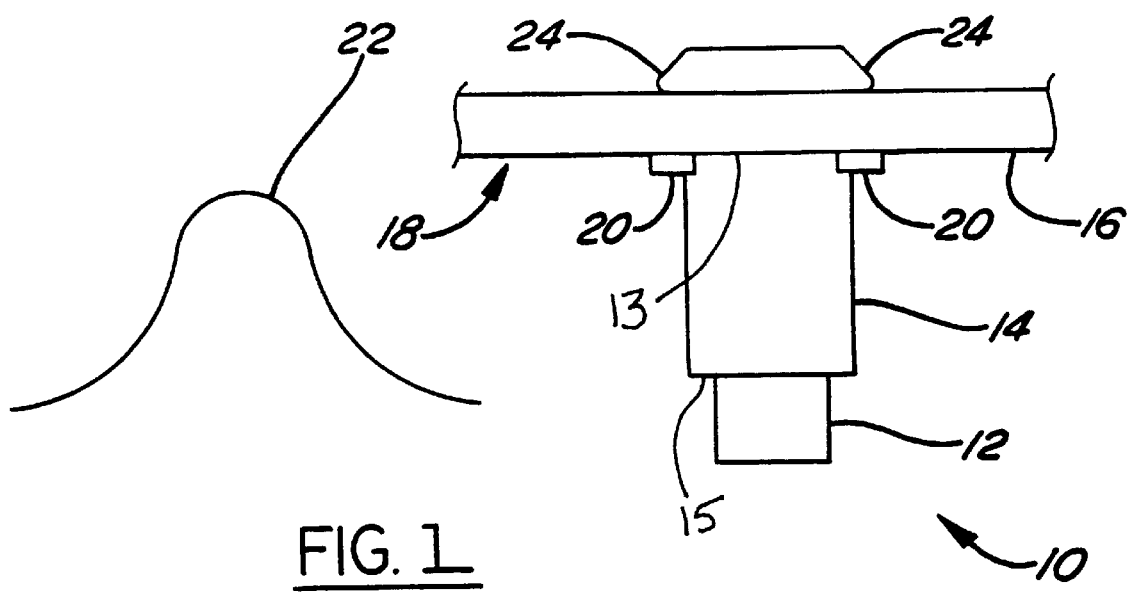
FIG. 1 is a cross section of an embodiment of a pedestalled LED in accordance with the present invention.

Referring now to FIG. 1, which is a cross section of an embodiment of a pedestalled LED 10 in accordance with the present invention. Although the pedestalled LED 10 is intended for use in automotive electronic applications, the pedestalled LED 10 is capable of being used in a variety of electronic applications including non-automotive.

The pedestalled LED 10 includes a light emitting diode element 12 and a tower element 14. The tower element 14 includes a base 13 and a top surface 15. The light emitting diode element 12 is mounted on the top surface 15 of the tower element 14. The light emitting diode element 12 is capable of withstanding exposure to wave solder. In one example, the heat generated from wave soldering can be approximately 250 degrees centigrade for 20 seconds. Light emitting diode elements (LEDs) capable of withstanding exposure to wave solder are known in the prior art. One known embodiment of LEDs capable of withstanding exposure to wave solder utilize minimum levels of epoxy in their construction. The utilization of small amounts of epoxy prevents steam from developing in the LED when exposed to the heat of wave soldering.

The tower element 14 is also capable of withstanding exposure to wave soldering. Plastics and other materials capable of withstanding such temperatures are also well known in the prior art. The use of such materials to form the tower element 14 when used in combination with a light emitting diode element 12 also capable of withstanding these temperatures, produces a pedestalled LED 10 that can be mounted on the side of a circuit board directly exposed to wave solder.

The pedestalled LED 10 is typically mounted to a circuit board 16. Although the pedestalled LED 10 is capable of being mounted to either side of the circuit board 16, its primary advantage is its capacity to be mounted on the wave solder side 18 of the circuit board 10. The pedesatalled LED 10 further includes terminals 20 that provide electrical connection to the light emitting diode element 12. As the wave solder 22 passes over the pedestalled LED 10, an electrical connection is secured between the terminals 20 and circuitry (not shown) on the circuit board 16.

In one embodiment, the pedestalled LED 10 is attached to the circuit board 16 through the use of a snap fit. The use of snap fittings is well known in the prior art. In one example, the tower element 14 has snap feet 24 which secure the tower element 14 to the circuit board 16 once the snap feet 24 are pushed through an opening in the circuit board 16. The use of a snap fit is highly beneficial in securing the pedestalled LED 10 to the circuit board 16, and minimizing movement of the pedestalled LED 10 as the wave solder 22 passes over it.

The pedestalled LED 10 of this invention provides a variety of benefits over the prior art. The present invention allows the simplistic creation of a light plane on the side of a circuit board where previously creation would have been difficult. Additionally, as the number of components located on the circuit board 16 increases, and the overall size of the end product decreases, open space on the circuit board 16 can become a premium. The ability to move the pedestalled LED 10 to the opposing side of the circuit board 16 can free up space on the non-wave soldered side of the circuit board. Furthermore, the use of inexpensive single sided circuit boards often can further increase the density of components on the non-wave soldered side of the circuit board. The use of the present invention expands the usage of such reduced cost circuit boards by again freeing up space on the non-wave soldered side of the circuit board.

While particular embodiments of the invention have been shown and described, numerous variations and alternative embodiments will occur to those skilled in the art. Accordingly, it is intended that the invention be limited only in terms of the appended claims.

What is claimed is:

1. A pedestalled LED assembly comprising:

a circuitboard having a wave solder side for exposure to wave solder;

a tower element formed from a tower material resistant to temperatures generated by exposure to wave solder, said tower element mounted on and protruding primarily from said wave solder side; and a light emitting diode element mounted on a top surface of said tower element, said light emitting diode element resistant to temperatures generated by exposure to wave solder;

wherein said light emitting diode element is placed in electrical communication with said circuitboard by exposing said circuitboard, said tower element, and said light emitting diode element to wave solder.

2. A pedestalled LED assembly as described in claim 1 wherein said tower element snap fits to said circuitboard.

3. A pedestalled LED assembly as disclosed in claim 1, wherein said circuitboard comprises a single-sided circuitboard.

4. The pedestalled LED assembly as described in claim 1, wherein said light emitting diode element contains low levels of epoxy.

5. The pedestalled LED assembly as described in claim 1 wherein said light emitting diode element is comprised of heat resistant epoxy.

6. The pedestalled LED assembly as described in claim 1 wherein said tower element comprises PBT.

7. The pedestalled LED as described in claim 1, wherein said tower element and said light emitting diode element are resistant to prolonged exposure to wave solder.

8. A pedestalled LED comprising:

a tower element formed from a tower material resistant to temperatures generated by exposure to wave solder, said tower element including snap fittings for mounting to a circuitboard;

a light emitting diode element mounted on a top surface of said tower element, said light emitting diode element resistant to temperatures generated by exposure to wave solder;

at least on terminal protruding between a tower base and said top surface such that exposure of said at least one terminal to wave solder would require exposure of said tower element and said light emitting diode element to wave solder.

9. The pedestalled LED as described in claim 8 for use in a surface mounted configuration on a single-sided circuitboard.

10. The pedestalled LED as described in claim 8 wherein said light emitting diode element is comprised of low levels of epoxy.

11. The pedestalled LED as described in claim 8 wherein said light emitting diode element is comprised of heat resistant epoxy.

12. The pedestalled LED as described in claim 8 wherein said tower element comprises PBT.

13. The pedestalled LED as described in claim 8 wherein said tower element comprises nylon.

14. The pedestalled LED as described in claim 8 for use on the side of a circuitboard exposed to wave solder.

15. A method of attaching a pedestal or LED, comprised of a light emitting diode element mounted on the top surface of a tower element, to a circuitboard comprising the steps of:

snap fitting the tower element to the circuitboard, the pedestalled LED being positioned on the side of the circuitboard to be exposed to wave solder; and wave soldering the circuitboard to create a permanent electrical connection between the pedestalled LED and the circuitboard.

16. A method of attaching a pedestalled LED to a circuitboard as described in claim 15 wherein the pedestalled LED is in a surface mounted configuration on a single-sided circuitboard.

17. A method of attaching a pedestalled LED to a circuitboard as described in claim 15 wherein the LED element is comprised of heat resistant epoxy.

18. A method of attaching a pedestalled LED to a circuitboard as described in claim 15 wherein the light emitting diode contains low levels of epoxy.

19. A method of attaching a pedestalled LED to a circuitboard as described in claim 15 wherein the tower element is comprised of PBT.

* * * * *